US 7,088,000 B2

(12) United States Patent
Cranmer et al.

(10) Patent No.: US 7,088,000 B2
(45) Date of Patent: Aug. 8, 2006

(54) METHOD AND STRUCTURE TO WIRE ELECTRONIC DEVICES

(75) Inventors: Michael S. Cranmer, Poughkeepsie, NY (US); Michael J. Domitrovits, New Paltz, NY (US); Benjamin V. Fasano, New Windsor, NY (US); Harvey C. Hamel, Poughkeepsie, NY (US); Charles T. Ryan, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 10/904,439

(22) Filed: Nov. 10, 2004

(65) Prior Publication Data

US 2006/0099801 A1    May 11, 2006

(51) Int. Cl.
  *H01L 23/48* (2006.01)
  *H01L 23/53* (2006.01)
  *H01L 29/40* (2006.01)
(52) U.S. Cl. ...................................... 257/767; 438/637
(58) Field of Classification Search ................ 257/767, 257/E23.145, E23.149; 438/623, 625, 637, 438/641, 674
See application file for complete search history.

(56) References Cited

U.S. PATENT DOCUMENTS

| 5,294,567 | A | 3/1994 | Dorfman et al. | |
|---|---|---|---|---|
| 5,456,942 | A | 10/1995 | Bebak et al. | |
| 5,728,244 | A | 3/1998 | Nanataki et al. | |
| 6,265,308 | B1 | 7/2001 | Bronner et al. | |
| 6,720,253 | B1 * | 4/2004 | Wada et al. | 438/637 |
| 6,887,785 | B1 * | 5/2005 | Dobuzinsky et al. | 438/638 |
| 2002/0164891 | A1 * | 11/2002 | Gates et al. | 438/780 |

FOREIGN PATENT DOCUMENTS

JP    2003283068    3/2003

* cited by examiner

*Primary Examiner*—Phuc T. Dang
(74) *Attorney, Agent, or Firm*—Gibb I.P. Law Firm, LLC; Ira D. Blecker, Esq.

(57) ABSTRACT

An integrated circuit structure and a method of manufacturing, wherein the method comprises forming a first via in an interconnect layer of the substrate, wherein the first via comprises a first size diameter; and forming a second via in the interconnect layer, wherein the second via comprises a second size diameter, the second size diameter being dimensioned larger than the first size diameter, wherein the second via comprises a non-uniform circumference, and wherein the substrate is configured in an approximately 1:1 ratio (i.e., approximately equal number) of the first and second vias. The first and second vias are laser formed or are formed by any of mechanical punching and photolithography. The second via is formed by sequentially forming multiple partially overlapping vias dimensioned and configured with the first size diameter. The first and second vias are arranged in a grid to allow for wiring of electronic devices.

19 Claims, 4 Drawing Sheets

METHOD AND STRUCTURE TO WIRE ELECTRONIC DEVICES

BACKGROUND OF INVENTION

1. Field of the Invention

The embodiments of the invention generally relate to integrated circuit technologies, and more particularly to wiring line structures for integrated circuits and methods of forming the same.

2. Description of the Related Art

Conventionally, semiconductor device operating voltages have been reduced to one volt and lower over time. Moreover, power consumption has increased due to higher circuit density and device leakage currents making resistive losses in the substrate important for power delivery to the die. Traditional electrical wiring for substrates and circuit boards used with electronic devices typically involves a single via diameter on a layer. To supplement the power in specific areas of a die high current capacity conductors are desired. At the same time, for some dielectric media such as alumina, impedance matching and shielding for GHz operational frequencies also requires small diameter vias to provide 50 ohms impedance.

U.S. Pat. No. 6,265,308 issued to Bronner et al., the complete disclosure of which, in its entirety, is herein incorporated by reference, teaches a process of forming wiring in a semiconductor interlayer dielectric. As Bronner teaches, generally, the resistance of metal lines is defined by a feature's height, width and resistivity. The height is often limited by arrays of the smallest feature size (e.g., memory arrays). However, due to capacitance and space minimization in these areas, the height of the metal lines may be limited. Conversely, using lines with a large line width results in an increased chip size. Therefore, the resistance of metal lines is globally restricted to values which do not allow for high current densities due to Joule heating of highly, resistive lines.

As a result, power bus lines, which are designed to carry high current densities, and signal or equipotential lines that do not allow a large potential gradient along the line, are typically designed on an additional metal level using a thicker metal height, or using broad or parallel lines on thin metal levels, which again, tend to increase the chip size. Thus, if thicker metal lines are desired for increased current capacity (and thus higher bus speeds for example), then the conventional techniques for producing thick metal lines generally include increasing the thickness of the metal layer and increasing the number of metal layers, each of which increases chip size and the number of processing steps, thereby resulting in increased manufacturing time and costs.

Additionally, for a given combination of conducting and insulating materials, the most desirable way to significantly reduce the capacitance of metal lines with narrow spacing is to make the metal stack sufficiently thin. Similarly, low resistance lines are produced by increasing their thickness accordingly. However, conventionally, both characteristics cannot be sufficiently united on one metal level. Moreover, conventional designs with single via diameters on each layer tend to compromise both impedance and power requirements. Likewise, similar constraints are encountered in the circuit definition and fabrication for substrates, circuit boards, and other interconnect devices which can be used with integrated circuit devices. Therefore, there remains a need for wiring conduits through the substrate of an integrated circuit that can be designed to satisfy both impedance and power requirements.

SUMMARY OF INVENTION

In view of the foregoing, an embodiment provides an integrated circuit substrate comprising a plurality of vias arranged in a grid to allow for wiring of electronic devices, wherein the plurality of vias comprise varied diameters and non-uniform circumferences in the same interconnect layer of the substrate, wherein the varied diameters comprise a first size diameter and a second size diameter, the second size diameter being dimensioned larger than the first size diameter, wherein vias configured with the second size diameter may comprise non-uniform circumferences, and wherein the plurality of vias comprise an approximately equal ratio of first size and second size diameters. According to one embodiment of the invention, the first size diameter comprises a 50–125 µm diameter and the second size diameter comprises a 75–150 µm diameter. In a first embodiment, the substrate comprises an organic substrate and in a second embodiment, the substrate comprises an inorganic substrate.

Another aspect of the invention provides a method of forming an integrated circuit substrate, wherein the method comprises forming a first via in an interconnect layer of the substrate, wherein the first via comprises a first size diameter; and forming a second via in the interconnect layer, wherein the second via comprises a second size diameter, the second size diameter being dimensioned larger than the first size diameter, wherein the second via comprises a non-uniform circumference, and wherein the substrate is configured with an approximately equal number of the first and second vias. In a first embodiment, the first and second vias are laser formed. In a second embodiment, the first and second vias are formed by any of mechanical punching and photolithography. Additionally, the second via is formed by sequentially forming multiple partially overlapping vias dimensioned and configured with the first size diameter. Moreover, the first and second vias are arranged in a grid to allow for wiring of electronic devices, wherein the first size diameter is configured into a 50–125 µm diameter and the second size diameter is configured into a 75–150 µm diameter. In one embodiment of the invention, the substrate is formed of an organic material, and in a second embodiment of the invention, the substrate is formed of an inorganic material.

An additional aspect of the invention provides a method of forming an integrated circuit substrate, wherein the method comprises forming a first via in an interconnect layer of the substrate, wherein the first via comprises a first size circumference; and sequentially punching multiple partially overlapping vias dimensioned and configured with the first size circumference to form a second via in the interconnect layer, wherein the second via comprises a non-uniform circumference, the second size circumference being dimensioned larger than the first size circumference, wherein the second via comprises a non-uniform circumference, wherein the second via is formed by sequentially forming multiple partially overlapping vias dimensioned and configured with the first size circumference, wherein the first and second vias are laser formed or formed by any of mechanical punching and photolithography, wherein the first and second vias are arranged in a grid to allow for wiring of electronic devices, and wherein the number of the first vias and the second vias is about equal.

The embodiments of the invention achieve several advantages including the flexibility to personalize the via cross-section. This flexibility optimizes bandwidth design addressing the conflicting requirements of a mixture of signal and power vias. In addition, for the cases in which a need exists for a few critical extra bandwidth demanding vias, one has additional design options. By trading off via density one can personalize the via cross-section and/or via perimeter to reduce the high frequency loss while maintaining the target characteristic impedance (typically approximately 50 ohms for a single ended line or a differential impedance of 100 ohms). This flexibility permits addressing multiple goals while minimizing undesirable electrical trade-offs.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF DRAWINGS

The embodiments of the invention will be better understood from the following detailed description with reference to the drawings, in which.

DETAILED DESCRIPTION OF PREFERRED EMBODIMENTS OF THE INVENTION

Figure 1:
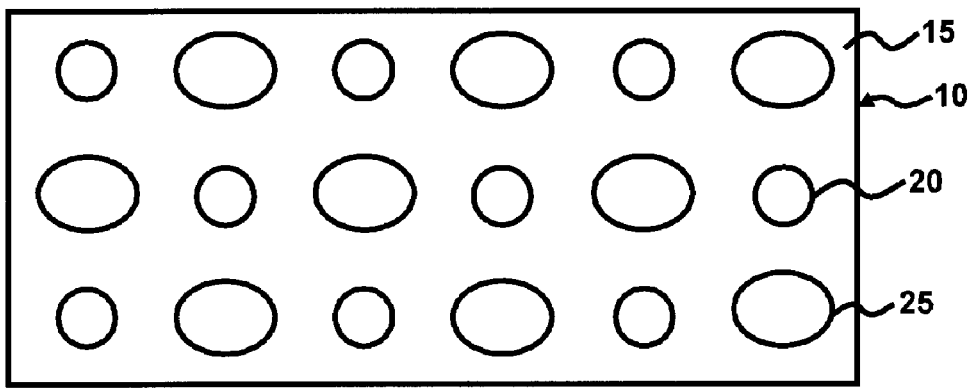
FIG. 1 is a schematic diagram of an integrated circuit substrate grid according to an embodiment of the invention.
Figure 2A:
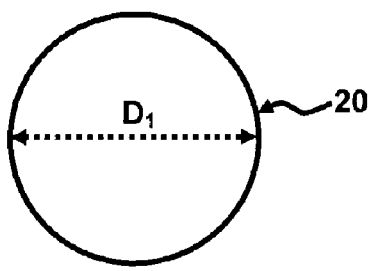
FIGS. 2(A) and 2(B) are top views illustrating a dimensional configuration of a small via according to an embodiment of the invention.
Figure 2B:
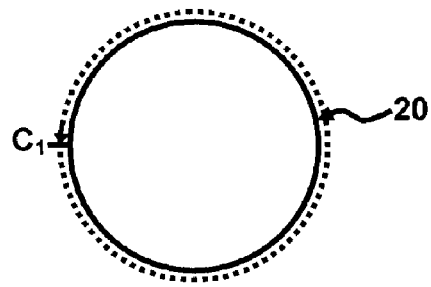
Figure 3A:
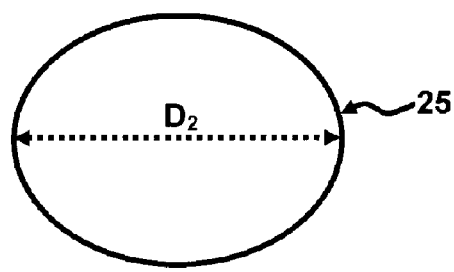
FIGS. 3(A) and 3(B) are top views illustrating a dimensional configuration of a large via according to an embodiment of the invention.
Figure 3B:
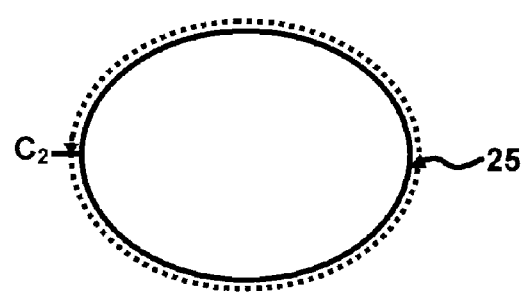

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for wiring conduits through the substrate of an integrated circuit that can be designed to satisfy both impedance and power requirements. The embodiments of the invention address this need by providing a technique of forming dual-sized vias in the same interconnect level of an integrated circuit substrate or chip carrier, such that the larger sized vias are formed by a multiple-punching technique using the small sized via punch heads. That is, instead of using different sized punch heads to form different sized vias, the embodiments of the invention utilize only one size punch head to create different sized vias. Referring now to the drawings, and more particularly to FIGS. 1 through 9(B) where similar reference characters denote corresponding features consistently throughout the figures, there are shown preferred embodiments of the invention.

FIG. 1 illustrates an integrated circuit substrate 10 comprising a plurality of vias 20, 25 arranged in a grid to allow for the wiring of electronic devices (not shown). As shown in FIGS. 2(A) through 3(B), the plurality of vias 20, 25 comprise varied diameters $D_1$, $D_2$ and non-uniform circumferences $C_2$ in the same interconnect layer 15 of the substrate 10, wherein the varied diameters comprise a first size diameter $D_1$ and a second size diameter $D_2$, with the second size diameter $D_2$ being dimensioned larger than the first size diameter $D_1$. Additionally, the vias 20, 25 are configured with the second size diameter $D_2$ comprises the non-uniform circumferences $C_2$. Alternatively, the circumference $C_2$ may be uniform. Moreover, the plurality of vias 20, 25 arranged in the grid comprise an approximate 1:1 ratio (i.e., an approximately equal number) of first size $D_1$ and second size $D_2$ diameters. The vias 25 with the second size diameter $D_2$ comprise multiple overlapping punch marks, wherein the punch marks have the first size diameter $D_1$. According to one embodiment of the invention, the first size diameter $D_1$ comprises a diameter in the range of 50–125 μm (preferably, approximately 60 μm) and the second size diameter $D_2$ comprises a diameter in the range of 75–150 μm (preferably, approximately 100 μm). Accordingly, by approximating the first and second vias 20, 25 as generally circular configurations, the respective circumferences $C_1$ and $C_2$ may be calculated using the general equation, $C=\pi D$, where $C_1$ is approximately 189 μm for a corresponding 60 μm diameter via 20, and $C_2$ is approximately 314 μm for a corresponding 100 μm diameter via 25. In a first embodiment, the substrate 10 comprises an organic substrate and in a second embodiment, the substrate 10 comprises an inorganic substrate.

The embodiments of the invention provide the selective formation of large vias 25 to improve current delivery to specific regions of an attached die (not shown). This is performed by a mechanical, photolithographic, or laser holing process (or any other known hole formation process) that increases select via feature size by either a multiple stroke punch via pattern or oversize via formation by laser processing. This allows, for instance in ceramic, smaller vias 20 to be used for shielding of signals in order to attain a 50 ohms impedance while also reducing the overall current drop within the substrate 10 due to via resistance when large vias 25 are selectively placed in overlying interconnect layers 15 to feed high power regions of the die (not shown). Known processes for punching and pattern deposition such as screening can be used to form the large vias 25 including using traditional pastes and mask configurations to fill these large vias 25. Also, lines and mesh patterns comprising conductive metals may be connected to some or all of the large vias 25 as is required to electrically connect the large vias 25.

Signal line via bandwidth is dominated by its characteristic impedance and requires approximately 50 ohms. This value is chosen to match the impedance of other interconnected devices and adjacent wiring. In addition the signal traces, including small vias 20 must be shielded and isolated by adjacent power (large) vias 25 to minimize the cross-talk between the signal lines to an acceptable level. At approximately a ratio of 1 to 1 of signal to power vias 20, 25, respectively, most of the benefits of power via shielding are achieved. The diameter consistent with these impedance and cross-talk requirements causes the signal via diameter to become small relative to the power vias 25. This is especially true as the density (i.e., the number of vias penetrating a layer) increases. Reducing the ratio of signal to power vias 20, 25, respectively, significantly would further call for a reduction of signal via diameter while significantly increasing the ratio of signal to power (to tolerate a larger diameter signal via) would increase the cross-talk between signal traces.

The power vias 25, on the other hand, require a very low impedance and a very low DC resistance. This requirement is continually becoming more critical as the current demanded by the circuitry increases while the voltage and allowable variation permitted becomes more restrictive. This is achieved by using a large diameter via 25 or cross-section for the power via 25.

Figure 4A:
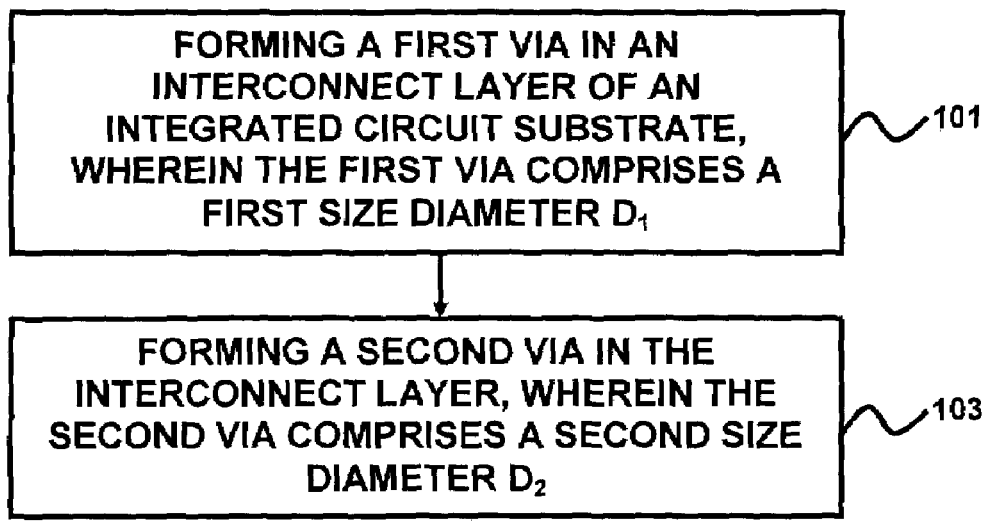
FIGS. 4(A) and 4(B) are flow diagrams illustrating preferred methods of an embodiment of the invention.
Figure 4B:
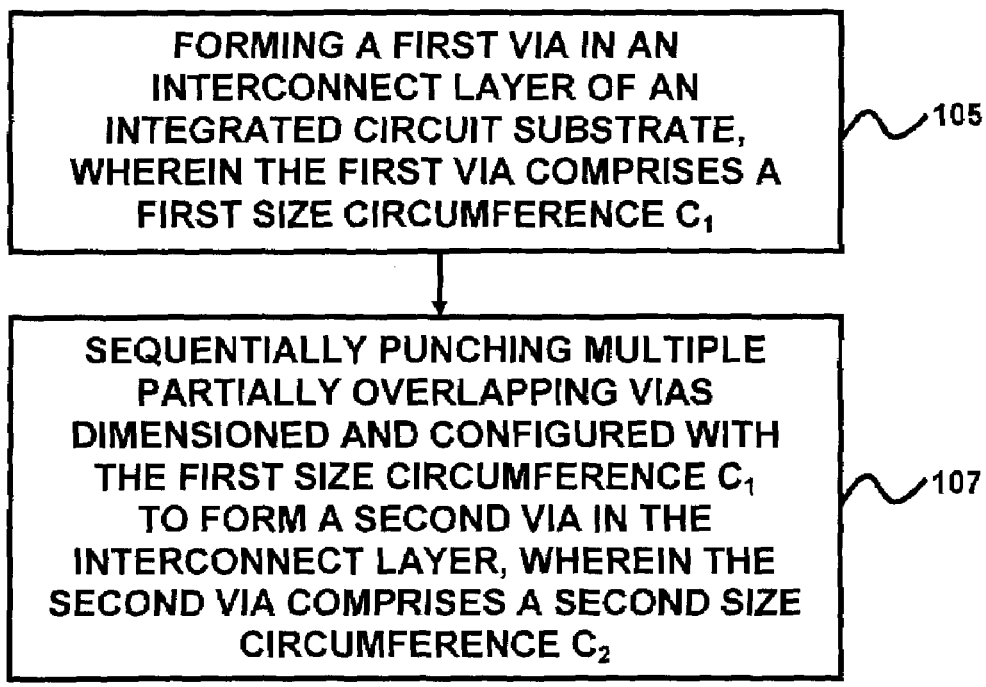

Other embodiments of the invention are illustrated in the flow diagrams of FIGS. 4(A) and 4(B) (with reference to the components described in FIGS. 1–3(B)). FIG. 4(A) illustrates a method of forming an integrated circuit substrate 10, wherein the method comprises forming (101) a first via 20 in an interconnect layer 15 of the substrate 10, wherein the first via 20 comprises a first size diameter $D_1$; and forming (103) a second via 25 in the interconnect layer 15, wherein the second via 25 comprises a second size diameter $D_2$, wherein the second size diameter $D_2$ is dimensioned larger than the first size diameter $D_2$, wherein the second via 25 comprises a non-uniform circumference $C_2$, and wherein the substrate 10 is configured in an approximately 1:1 ratio of the first and second vias 20, 25 (i.e., the number of the first vias 20 and the second vias 25 is about equal). In a first embodiment, the first and second vias 20, 25 are laser formed. In a second embodiment, the first and second vias 20, 25 are formed by mechanical punching. Additionally, the second via 25 is formed by sequentially forming multiple partially overlapping vias dimensioned and configured with the first size diameter $D_1$.

FIG. 4(B) illustrates a method of forming an integrated circuit substrate (or chip carrier) 10, wherein the method comprises forming (105) a first via 20 in an interconnect layer 15 of the substrate 10, wherein the first via 20 comprises a first size circumference $C_1$; and sequentially punching (107) multiple partially overlapping vias 20 dimensioned and configured with the first size circumference $C_1$ to form a second via 25 in the interconnect layer 15, wherein the second via 25 comprises a second size circumference $C_2$. The second size circumference $C_2$ is dimensioned larger than the first size circumference $C_1$, wherein the second via 25 comprises a non-uniform circumference $C_2$, wherein the second via 20 is formed by sequentially forming multiple partially overlapping vias dimensioned and configured with the first size circumference $C_1$.

Figure 5A:
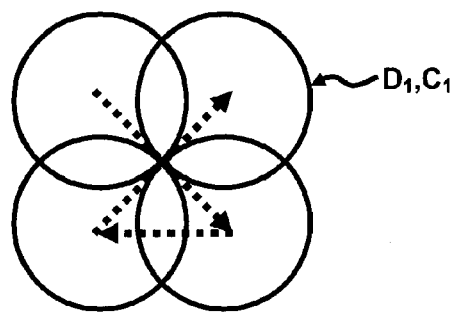
FIG. 5(A) is a top view illustrating a punching sequence for forming a large via according to a first embodiment of the invention.
Figure 5B:
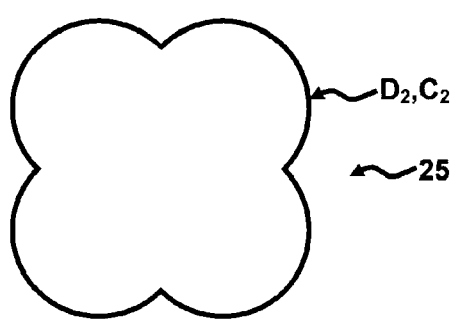
FIG. 5(B) is a top view of a large via resulting from the punching sequence shown in FIG. 5(A) according to a first embodiment of the invention.

FIG. 5(A) illustrates a punching sequence for forming the large via 25 according to a first embodiment of the invention. Generally, a punch head configured with a diameter $D_1$ and circumference $C_1$ (i.e., configured in a small via 20 configuration) is sequentially punched in an overlapping manner to form a large via 25 (having a diameter $D_2$ and circumference $C_2$) such as that shown in FIG. 5(B). The punching sequence can be conducted in any order. For example, FIG. 5(A) illustrates a criss-cross (diagonal) punching sequence as denoted by the dotted arrowed lines, wherein the upper left punch occurs first, followed by the lower right, followed by the lower left, and finally the upper right. Generally, the punching sequence provides for a slightly offset sequential punching sequence whereby multiple small via punching strokes are performed approximately 10–20 μm offset from the previously punched hole. Again, the punching sequence for forming the large via 25 can be conducted in any order, and the embodiments of the invention are not limited to any particular punching sequence.

Figure 6A:
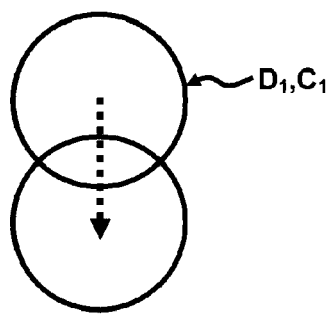
FIG. 6(A) is a top view illustrating a punching sequence for forming a large via according to a second embodiment of the invention.
Figure 6B:
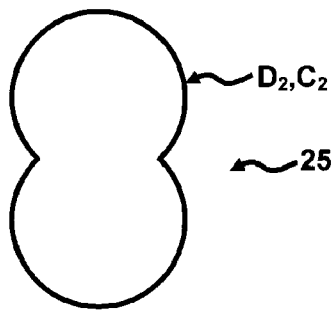
FIG. 6(B) is a top view of a large via resulting from the punching sequence shown in FIG. 6(A) according to a second embodiment of the invention.
Figure 7A:
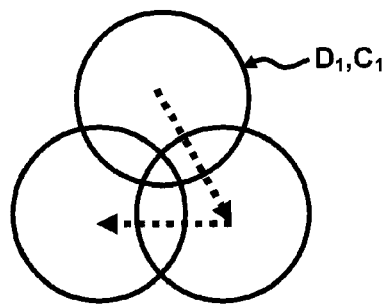
FIG. 7(A) is a top view illustrating a punching sequence for forming a large via according to a third embodiment of the invention.
Figure 7B:
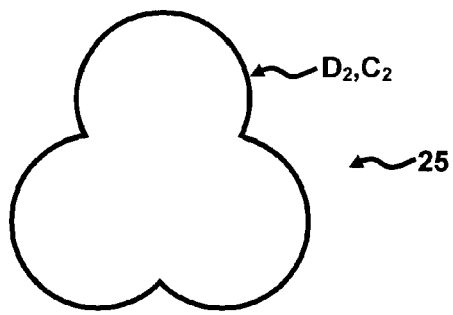
FIG. 7(B) is a top view of a large via resulting from the punching sequence shown in FIG. 7(A) according to a third embodiment of the invention.
Figure 8A:
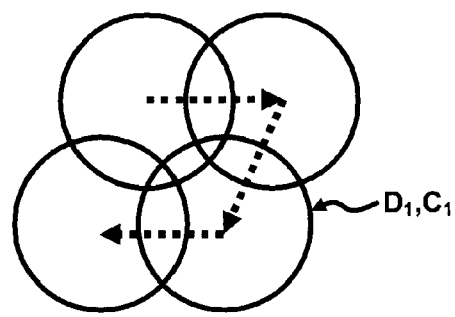
FIG. 8(A) is a top view illustrating a punching sequence for forming a large via according to a fourth embodiment of the invention.
Figure 8B:
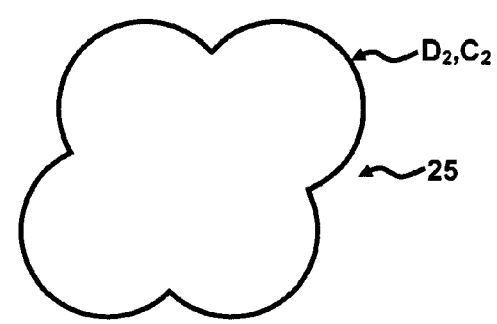
FIG. 8(B) is a top view of a large via resulting from the punching sequence shown in FIG. 8(A) according to a fourth embodiment of the invention.
Figure 9A:
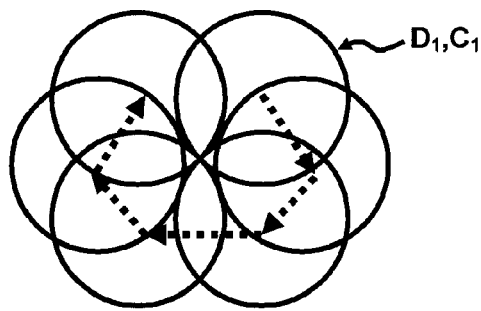
FIG. 9(A) is a top view illustrating a punching sequence for forming a large via according to a fifth embodiment of the invention.
Figure 9B:
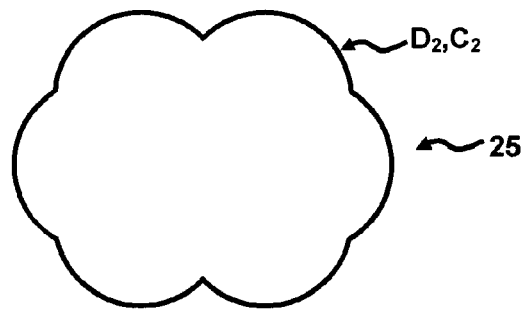
FIG. 9(B) is a top view of a large via resulting from the punching sequence shown in FIG. 9(A) according to a fifth embodiment of the invention.

FIGS. 6(A) and 6(B) illustrate the respective linear punching sequence and corresponding configuration of the large via 25 according to a second embodiment of the invention, wherein the configuration of the large via 25 is in a dumbbell-like "FIG. 8" configuration. FIGS. 7(A) and 7(B) illustrate a triangular punching sequence and configuration for the large via 25 according to a third embodiment of the invention. FIGS. 8(A) and 8(B) illustrate a parallelogram punching sequence and configuration for the large via 25 according to a fourth embodiment of the invention. Moreover, FIGS. 9(A) and 9(B) illustrate a hexagonal punching sequence and configuration for the large via 25 according to a fifth embodiment of the invention. Other configurations are also possible according to the embodiments of the invention. Also, a combination of patterns is possible, and the embodiments of the invention are not limited to any particular configuration or pattern.

The embodiments of the invention provide a multilayer substrate 10, which may be either a ceramic substrate or an organic substrate, in which there are different sized vias 20, 25 for power/ground on the one hand and signal on the other hand. Preferably, the small vias 20 provide the shielding for the signal and the large vias 25 provide the power/ground electrical enhancements. The formation of the large vias 25 may be performed by a "nibbling" technique in which several small vias 20 are punched to form one large via 25. Moreover, slotted vias can also be formed in this manner. By forming the large vias 25 in this manner, only one punch head needs to be used to form both the small vias 20 and large vias 25, thereby resulting in faster and more efficient punching of the vias 20, 25.

The embodiments of the invention achieve several advantages including the flexibility to personalize the via cross-section. This flexibility optimizes bandwidth design addressing the conflicting requirements of a mixture of signal and power vias 20, 25, respectively. In addition, for the cases in which a need exists for a few critical extra bandwidth demanding vias, one has additional deign options. By trading off via density one can personalize the via cross-section and/or via perimeter to reduce the high frequency loss while maintaining the target characteristic impedance (typically approximately 50 ohms for a single ended line or a differential impedance of 100 ohms). This flexibility permits addressing multiple goals while minimizing undesirable electrical trade-offs.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

What is claimed is:

1. An integrated circuit substrate comprising:
    a plurality of vias arranged in a grid, said plurality of vias comprising varied diameters and non-uniform circumferences in the same interconnect layer of said substrate,
    wherein said varied diameters comprise a first size diameter and a second size diameter, said second size diameter being dimensioned larger than said first size diameter,
    wherein said plurality of vias comprise an approximately equal ratio of first size and second size diameters, and
    wherein vias comprising said first size diameter are adapted for shielding of electric signals and vias comprising said second size diameter are adapted for electrical power enhancement.

2. The integrated circuit substrate of claim 1, wherein said first size diameter comprises a 50–125 μm diameter.

3. The integrated circuit substrate of claim 1, wherein said second size diameter comprises a 75–150 μm diameter.

4. The integrated circuit substrate of claim 1, wherein said substrate comprises an organic substrate.

5. The integrated circuit substrate of claim 1, wherein said substrate comprises an inorganic substrate.

6. An integrated circuit substrate comprising:
    a plurality of vias comprising varied diameters and non-uniform circumferences in the same interconnect layer of said substrate,
    wherein said varied diameters comprise a first size diameter and a second size diameter, said second size diameter being dimensioned larger than said first size diameter,
    wherein said plurality of vias comprise an approximately equal ratio of first size and second size diameters; and
    wherein vias configured with said second size diameter comprise said non-uniform circumferences.

7. A method of forming an integrated circuit substrate, said method comprising:
    forming a first via in an interconnect layer of said substrate, wherein said first via comprises a first size diameter; and
    forming a second via in said interconnect layer, wherein said second via comprises a second size diameter, said second size diameter being dimensioned larger than said first size diameter,
    wherein said second via comprises a non-uniform circumference, and
    wherein said substrate is configured with an approximately equal number of the first and second vias.

8. The method of claim 7, wherein said first and second vias are laser formed.

9. The method of claim 7, wherein said first and second vias are formed by any of mechanical punching and photolithography.

10. The method of claim 7, wherein said second via is formed by sequentially forming multiple partially overlapping vias dimensioned and configured with said first size diameter.

11. The method of claim 7, wherein said first and second vias are ranged in a grid.

12. The method of claim 7, wherein said first size diameter is configured into a 50–125 μm diameter.

13. The method of claim 7, wherein said second size diameter is configured into a 75–150 μm diameter.

14. The method of claim 7, wherein said substrate is formed of an organic material.

15. The method of claim 7, wherein said substrate is fanned of an inorganic material.

16. A method of forming an integrated circuit substrate, said method comprising:
    forming a first via in an interconnect layer of said substrate, wherein said first via comprises a first size circumference; and
    forming a second via in said interconnect layer, wherein said second via comprises a second size circumference, said second size circumference being dimensioned larger than said first size circumference; and
    sequentially punching multiple partially overlapping vias dimensioned and configured with said first size circumference to form a second via in said interconnect layer,
    wherein said second via comprises a non-uniform circumference.

17. The method of claim 16, wherein the first and second vias are laser formed.

18. The method of claim 16, wherein the first and second vias are formed by any of mechanical punching and photolithography.

19. The method of claim 16, wherein the first and second vias are arranged in a grid, and wherein the number of the first vias and the second vias is about equal.

* * * * *